(12) United States Patent
Foti et al.

(10) Patent No.: US 9,276,149 B2
(45) Date of Patent: Mar. 1, 2016

(54) THIN FILM SOLAR CELL MODULE INCLUDING SERIES-CONNECTED CELLS FORMED ON A FLEXIBLE SUBSTRATE BY USING LITHOGRAPHY

(75) Inventors: Marina Foti, Catania (IT); Noemi Graziana Sparta, Catania (IT); Salvatore Lombardo, Catania (IT); Silvestra Dimarco, Valverde CT (IT); Sebastiano Ravesi, Catania (IT); Cosimo Gerardi, Motta S. AnastasIA (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 802 days.

(21) Appl. No.: 13/556,469

(22) Filed: Jul. 24, 2012

(65) Prior Publication Data

US 2013/0032197 A1  Feb. 7, 2013

(30) Foreign Application Priority Data

Aug. 3, 2011  (IT) .............................. VI2011A0220

(51) Int. Cl.
*H01L 31/0463*  (2014.01)

(52) U.S. Cl.
CPC ............. *H01L 31/0463* (2014.12); *Y02E 10/50* (2013.01)

(58) Field of Classification Search
CPC ........................... H01L 25/042; H01L 27/142
See application file for complete search history.

(56) References Cited

U.S. PATENT DOCUMENTS

| 5,453,134 A | 9/1995 | Arai et al. |
| 2007/0227578 A1* | 10/2007 | Perozziello ......... H01L 31/0322 136/244 |
| 2011/0155234 A1* | 6/2011 | Chou .................. H01L 31/0749 136/256 |

FOREIGN PATENT DOCUMENTS

| DE | 3714920 | 7/1988 |
| WO | 2011061160 | 5/2011 |

* cited by examiner

*Primary Examiner* — Yu Chen
*Assistant Examiner* — Nilufa Rahim
(74) *Attorney, Agent, or Firm* — Allen, Dyer, Doppelt, Milbrath & Gilchrist, P.A.

(57) ABSTRACT

Solar thin film modules are provided with reduced lateral dimensions of isolation trenches and contact trenches, which provide for a series connection of the individual solar cells. To this end lithography and etch techniques are applied to pattern the individual material layers, thereby reducing parasitic shunt leakages compared to conventional laser scribing techniques. In particular, there may be series connected solar cells formed on a flexible substrate material that are highly efficient in indoor applications.

22 Claims, 10 Drawing Sheets

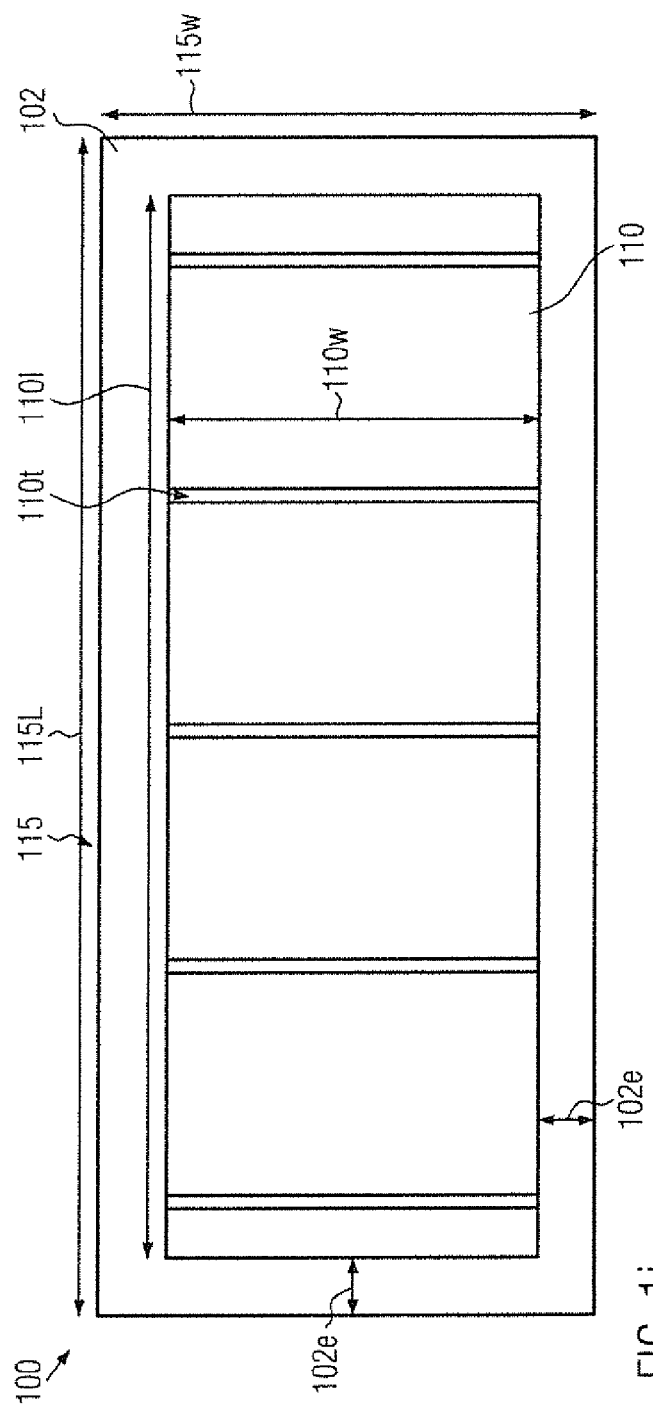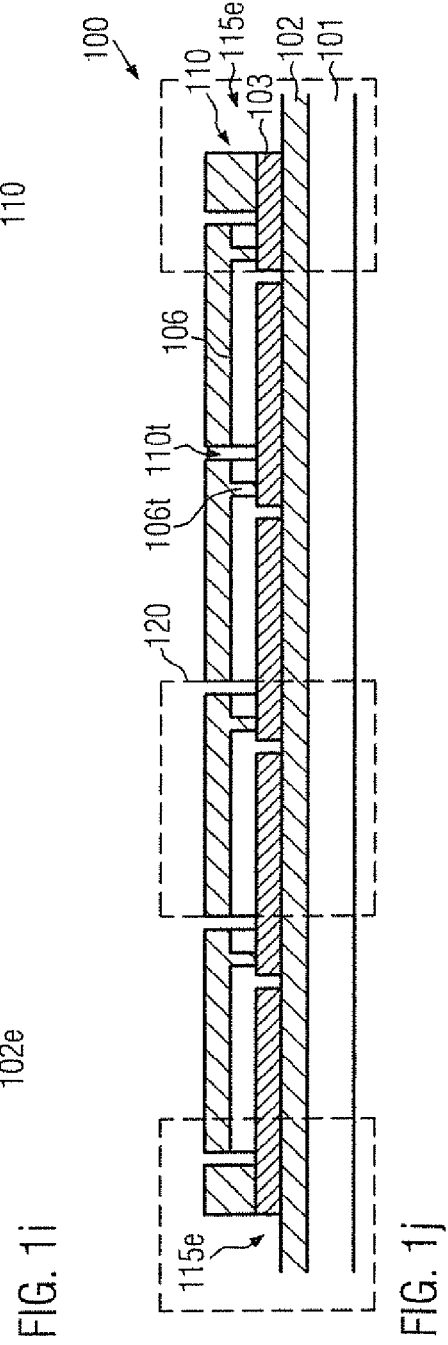
FIG. 1i
FIG. 1j

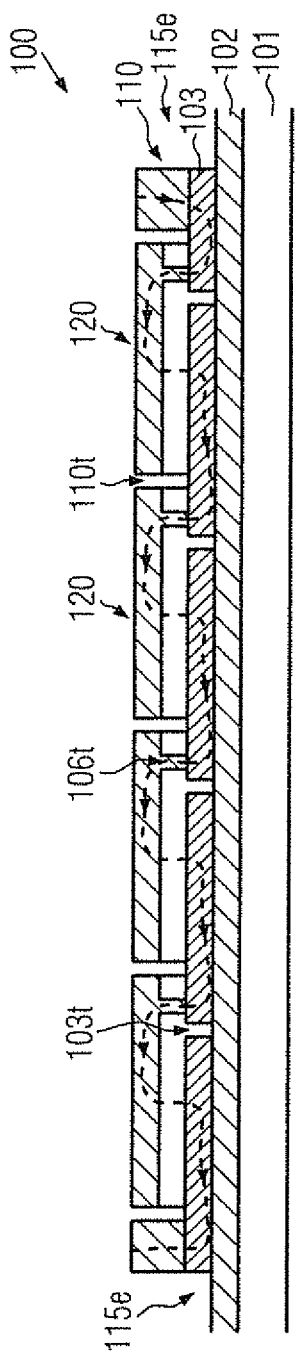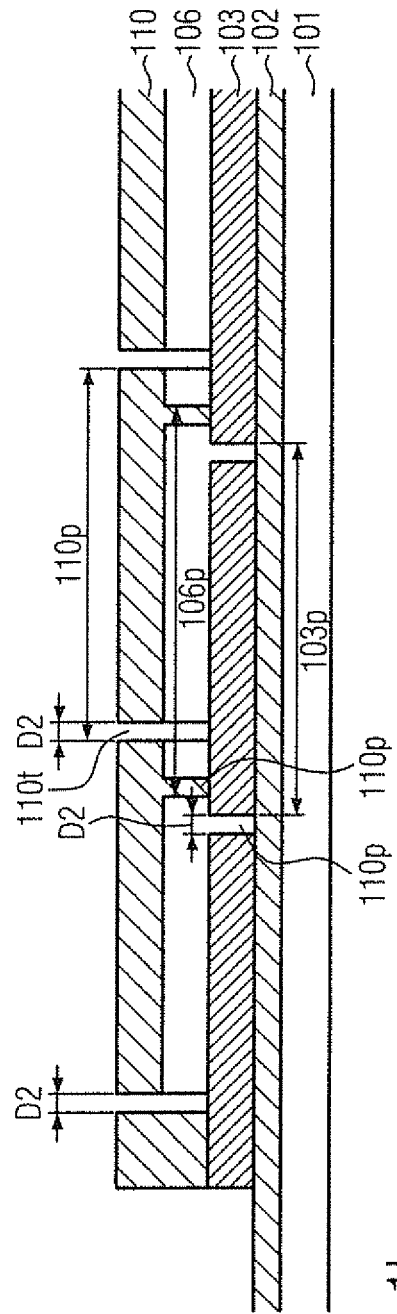
FIG. 1k
FIG. 1l

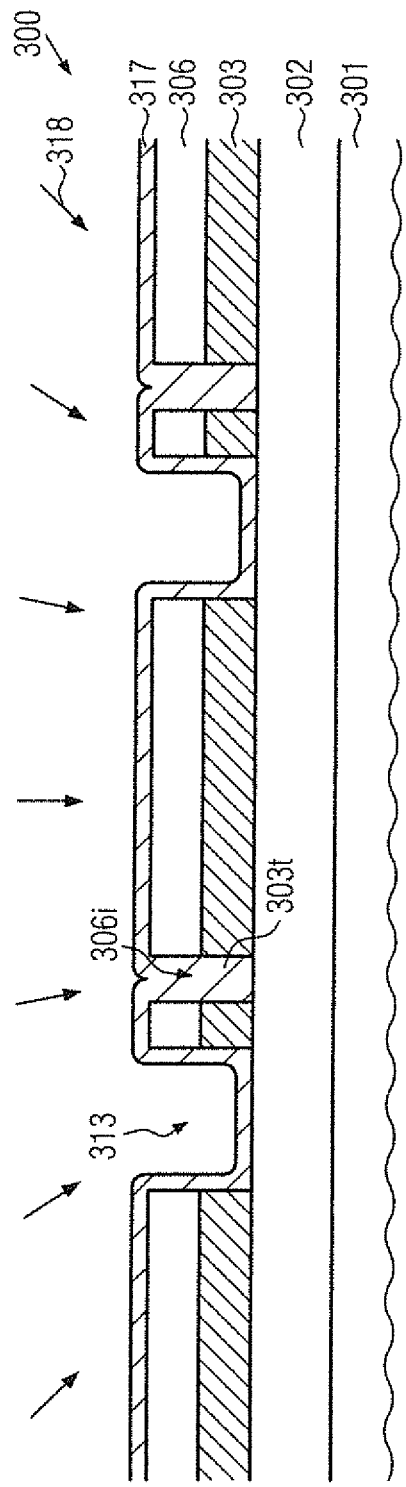
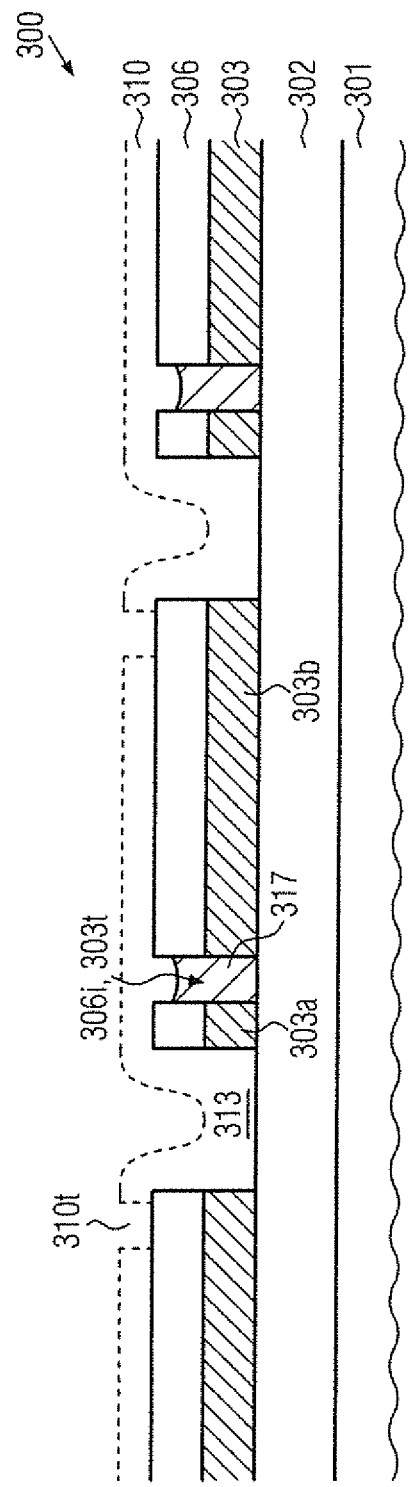
FIG. 3b
FIG. 3c

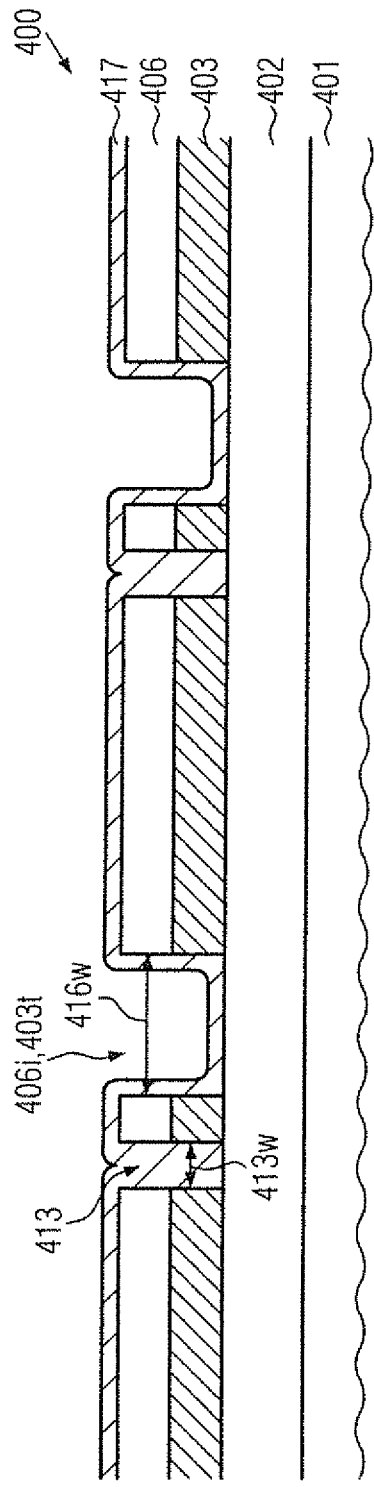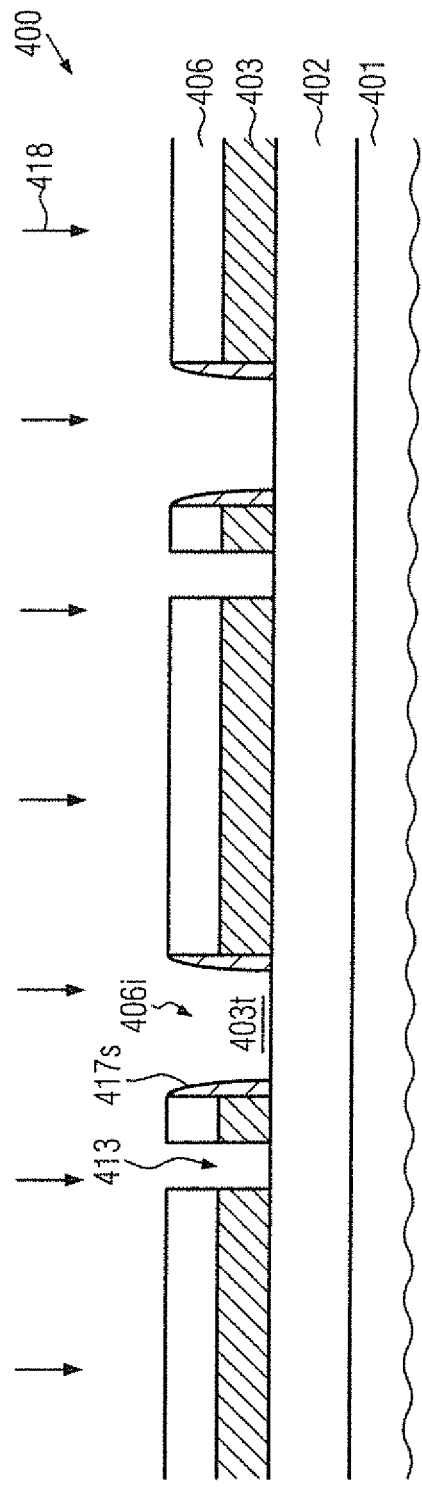
FIG. 4a
FIG. 4b

THIN FILM SOLAR CELL MODULE INCLUDING SERIES-CONNECTED CELLS FORMED ON A FLEXIBLE SUBSTRATE BY USING LITHOGRAPHY

FIELD OF THE INVENTION

Generally speaking, the present invention relates to solar cell technology, and in particular to solar cells for indoor applications.

BACKGROUND OF THE INVENTION

Thin-film solar cell technology based on appropriate semiconductive materials, such as amorphous silicon (a-Si:H), is very promising for generating low-cost solar energy. This thin-film solar cell technology may be used for cost-effective applications such as large area photovoltaic modules and cells applied to any appropriate carrier material. For example, semiconductor materials and metallization layers may be applied to flexible substrates, thereby enabling the production of lightweight rollable and/or foldable solar modules which allow efficient storage and transport.

Generally, the particular size, shape and design of thin-film solar cells formed on flexible substrates allow for innovative design of circuit interconnections including efficient designs that may minimize the impact of shading effects that would otherwise be impractical for conventional large area solar cells.

In particular, photovoltaic flexible modules are highly advantageous for indoor energy harvesting applications. In this case, the solar module has to comply with the requirements of low intensity of light that is available from indoor lamps, such as fluorescence lamps. The intensity of such light sources is about 1/1000 of the sun light intensity under standard outdoor conditions (radiation travelling a distance through the atmosphere that is 1.5 times the height the atmosphere). In addition the spectral composition of radiation emitted from indoor light sources is very different from the spectral composition under outdoor conditions. Under these specific environmental conditions the performance of the solar cell is typically reduced due to a significant impact of defects and parasitic resistances of the solar cells. In particular the impact of variable dark leakage current at low biases, which is commonly referred to as shunt leakage current, is noticeable at reduced light intensities. When this shunt leakage is sufficiently high it reduces the fill factor, i.e. the ratio of the maximum power point (MPP) and the power defined by open voltage and short circuit current of a solar cell, thereby adversely affecting the cell efficiency. Hence, for solar modules to be operated mainly under environmental conditions with reduced light intensity, for instance in indoor applications, it is highly advantageous to minimize the effect of the shunt resistances which are induced mainly during the processing of the photovoltaic modules.

Series connection of thin film solar cells in the module is usually accomplished by patterning the material layers using laser scribing techniques. Especially for large area modules this technique is very effective in removing layers by ablation so as to pattern the solar cells. To this end the laser parameters have to be carefully adjusted with respect to intensity, focus size and wavelength in order to appropriately remove material of the layer under consideration without unduly affect other material layers and to provide an appropriate pattern that allows a series connection of individual solar cells.

Appropriate laser parameters can be achieved on large area robust substrates, such as glass and metal, thereby allowing highly automated manufacturing environments to be implemented for forming solar modules with series connected solar cells with a desired size, number and shape.

Nevertheless, even with well-tuned laser scribing processes it is very difficult to avoid the generation of defects, such as metal flakes during the processing in particular of the metal back side contact, thereby contributing to shunt leakages.

Furthermore, the patterning of the structures of the various layers with a laser is limited in terms of dead areas caused by the beam size, which is typically constrained to approximately 50 to 60 µm, thereby resulting in a loss of active cell area.

SUMMARY OF THE INVENTION

It is therefore an object of the present invention to provide solar modules including thin-film solar cells and corresponding manufacturing techniques, while avoiding or at least reducing the effects of one or more of the problems identified above.

According to one aspect of the present invention the object is addressed by a method of forming a solar module. The method comprises forming a rear side metallization layer on an insulating substrate material and forming a p and n doped semiconductor layer on the rear side metallization layer. Moreover, a first isolation trench is formed in the rear side metallization layer and a contact trench and a second isolation trench are formed in the p and n-doped semiconductor layer so as to provide laterally isolated semiconductor regions. The method further comprises forming a transparent front side metallization layer on the p and n-doped semiconductor layer and in the contact trench, wherein the first isolation trench and/or the contact trench and/or the second isolation trench are formed by applying a lithography process. Additionally, the method comprises patterning at least the front side metallization layer so as to form series-connected solar cells based on the laterally isolated semiconductor regions of the p and n-doped semiconductor layer.

According to this aspect of the present invention a manufacturing technique for forming a solar module includes the application of at least one lithography process for appropriately patterning the rear side metallization layer and/or the semiconductor material of the module. Using lithography processes for patterning, in particular, the rear side metallization layer may contribute to a significantly reduced probability of creating metal flakes, which has been identified in laser scribing processes as causing significant leakage currents. Consequently, the total efficiency of the solar module can be increased, which is highly advantageous in the context of indoor applications, in which conventional thin-film solar modules suffer from a pronounced degradation of conversion efficiency.

Furthermore, even when using relatively low-cost lithography techniques the lateral dimensions of the isolation trenches and contact trenches may be significantly less compared to the corresponding critical dimensions that may be achieved by applying conventional laser scribing techniques, even if these techniques are implemented on the basis of highly optimised process parameters. Thus, in addition to reducing patterning related defects, in particular when patterning metallization layers, the dead area of the solar module may also be reduced compared to conventional laser scribing techniques.

Furthermore, applying at least one lithography process allows a high degree of freedom in selecting an appropriate substrate material for the solar module, since the process result of lithography and associated etch techniques may be substantially independent of the material characteristics of the substrate.

In a further advantageous embodiment patterning at least the front side metallization layer comprises applying a further lithography process.

Hence, the material layers used in the solar module may efficiently be processed on the basis of lithography techniques, thereby allowing the implementation of desired reduced critical dimensions compared to laser scribing techniques. On the other hand even, with reduced lateral dimensions, the probability of creating leakage paths in patterning the front side metallization layer is reduced.

In a further illustrative embodiment patterning at least the front side metallization layer comprises forming a third isolation trench in the front side metallization layer, wherein the second isolation trench in the p and n-doped semiconductor layer and the third isolation trench are formed in a common lithography and etch sequence. In this manner, a single lithography and etch sequence is sufficient for patterning the front side metallization layer and at the same time providing the laterally separated semiconductor regions so that an efficient series connection of the individual separated semiconductor regions is accomplished on the basis of reduced critical dimensions of the isolation trenches.

In a further illustrative embodiment forming the first isolation trench in the rear side metallization layer comprises applying a first lithography and etch sequence prior to forming the p and n-doped semiconductor layer. In this case the patterning of the rear side metallization layer is accomplished by specifically selected design parameters, while also the actual patterning of the rear side metallization layer on the basis of an etch process allows increased flexibility in selecting appropriate etch recipes, since other sensitive materials are not present in this manufacturing stage.

In a further embodiment, the contact trench is then formed by applying a second lithography and etch sequence. In this case, superior flexibility in selecting etch recipes and generally process parameters is achieved, while in particular the selection of the etch parameters may ensure a desired high selectivity with respect to the underlying rear side metallization layer.

In a further illustrative embodiment, the first isolation trench in the rear side metallization layer and the second isolation trench and the contact trench in the p and n-doped semiconductor layer are formed by performing a single lithography and etch sequence.

In this embodiment, the rear side metallization layer and the p and n-doped semiconductor layer, which may be provided in the form of a p-i-n semiconductor layer (wherein "i" stands for "intrinsic layer), may be deposited and may then commonly patterned on the basis of a single process sequence, thereby efficiently reducing the number of lithography processes. Hence, also the number of lithography masks that are used for patterning and series-connecting the solar cells may be reduced, thereby achieving even further reduced overall production cost.

In one illustrative embodiment the single lithography and etch sequence is performed such that the contact trench is formed with a greater width than the first and second isolation trenches. Furthermore, a conformal dielectric layer is formed so as to cover exposed surface areas of the contact trench and so as to substantially completely fill the first and second isolation trenches. Thereafter the conformal layer is removed from the contact trench prior to forming the front side metallization layer.

In this embodiment the different lateral dimensions of the contact trench and the first and second isolation trenches are taken advantage of so as to substantially completely fill the first and second isolation trenches, which may represent a single trench formed commonly in the semiconductor layer and the underlying rear side metallization layer so that the application of an etch process results in an increased removal rate in the contact trench compared to the first and second isolation trenches. Consequently, a significant amount of the dielectric material is preserved in the isolation trenches, thereby contributing to superior dielectric characteristics and thus reducing the overall leakage current between neighbouring solar cells. On the other hand the sidewalls in the contact trench may reliably be exposed so that a desired electrical contact is established upon depositing the transparent front side metallization layer.

In one advantageous embodiment, the removal of the conformal layer from the contact trench is accomplished by performing a non-masked isotropic etch process. In this manner, a desired high etch rate is obtained within the contact trench, thereby ensuring a reliable removal of the dielectric material.

In a further illustrative embodiment, the contact trench is formed with a width that is less than a width of the first and second isolation trenches. Moreover, in this embodiment the inventive method further comprises forming a dielectric layer above the contact trench and in the first and second isolation trenches, and patterning the dielectric layer so as to re-open the contact trench and form sidewall spacers and sidewalls of the first and second isolation trenches.

In this embodiment the dielectric characteristics of the isolation trenches are also established on the basis of a deposition process, which is controlled such that the contact trench is closed without a significant material deposition into the contact trench, while on the other hand the sidewalls of the isolation trenches are reliably covered by the dielectric material. On the basis of the subsequent etch process, the previously closed contact trench is opened again while at the same time sidewall spacers are formed on the sidewalls of the first and second isolation trenches, thereby providing for the desired dielectric characteristics of the isolation trenches. Thereafter, the front side metallization layer is deposited so as to substantially completely fill the contact trench, thereby establishing the electrical connections required for obtaining the series connection of the various solar cells.

Consequently, also in this manufacturing regime a reduced number of lithography processes may be applied, wherein the series connection is then established on the basis of deposition and etch processes. Since typically lithography processes mainly contribute to the overall manufacturing cost, a reduction of the number of lithography steps and associated lithography masks significantly increases efficiency of the overall manufacturing process.

In illustrative embodiments of the present invention the contact trench and/or the first and second isolation trenches are formed with a width that is 25 µm or less. As discussed above, a significant reduction of the trenches can be achieved by applying at least one lithography process, thereby increasing the area that is available for the actual light-sensitive portions of the semiconductor layer. In this case, the solar module is especially advantageous for the application in indoor environments, since here not only an increase of the total efficiency improves the energy harvesting efficiency, but also the increased ratio of active semiconductor area two non-light sensitive areas used for implementing the series connection in the solar module contributes to superior performance. In particularly advantageous embodiments, the lateral dimensions of any isolation trenches and contact trenches is selected to be 25 μm or less, and, in particular, these dimensions may be selected to approximately 10 μm and less. In some embodiments, the dimensions may be 6 μm and less even when using non-critical lithography and etch techniques, thereby improving the area ratio by approximately a factor of 10 compared to even well tuned laser scribing techniques.

In one preferred embodiment, the insulating substrate material is a flexible substrate material. As discussed above the usage of flexible substrate materials is highly contagious, for instance in the context of indoor applications, wherein the present invention provides for a proceed increased light conversion efficiency due to the reduction of leakage paths upon patterning the solar modules, since the lithography and etching technique is significantly less sensitive to the type of substrate material used compared to laser scribing techniques. In one illustrative embodiment the semiconductor layer is formed as an amorphous and/or microcrystalline semiconductor layer. In this case well established materials may be used, for which appropriate deposition techniques are readily available. For example, CVD (chemical vapour deposition) techniques are well-established in the art for forming amorphous hydrogenated silicon layers and/or microcrystalline semiconductor layers at desired low temperatures, for instance at or below 200° C., while in other cases also roll to roll techniques may efficiently be applied. The semiconductor layer may for instance be provided in the form of a p-i-n layer, wherein, for instance, the p-doped layer may be formed as a top layer of the semiconductor material in order to enhanced charge carrier accumulation, as is well known in the art.

It should be appreciated, however, that any other semiconductor materials may be used, such as compound semiconductors and the like, for which appropriate deposition and doping techniques are available.

According to a further aspect of the present invention the object is addressed by a solar cell module. The solar cell module comprises a rear side metallization layer formed on a substrate material and comprising a plurality of first isolation trenches. The module further comprises a p and n-doped semiconductor layer formed on the rear side metallization layer and laterally divided into a plurality of semiconductor regions by a plurality of second isolation trenches. Additionally the module comprises a transparent front side metallization layer formed on the semiconductor regions and comprising a plurality of third isolation trenches so as to form a plurality of series-connected solar cells, wherein the first, second and third isolation trenches have a width of 25 μm or less, and particularly a width of 10 μm or less. As discussed above the implementation of isolation trenches with the above specified lateral dimensions significantly reduces the dead area in the module compared to conventional thin-film solar modules, thereby providing significant advantages in particular in environments with reduced light intensity. As also alluded to earlier, typically dimensions of contact and isolation trenches in the above specified range may not be provided on the basis of well-established conventional laser scribing techniques. By using alternative patterning techniques, for instance as discussed above, in particular the probability of creating patterning related irregularities in the form of metal flakes may considerably be reduced compared to the laser scribing techniques so that the overall internal conversion efficiency is enhanced in particular for reduced light intensities.

In one preferred embodiment the substrate material is a flexible substrate material. For example, materials, such as polyimide or in general plastics such as polyethylene-naphtalate (PEN) or polyethylene-terephtalate (PET) may be used, thereby providing superior flexibility in selecting a desired substrate material compared to conventional solar modules.

BRIEF DESCRIPTION OF THE DRAWINGS

Further embodiments are also defined in the appended claims and are described in more detail in the following description by referring to the accompanying drawings, in which:

DETAILED DESCRIPTION OF THE PREFERRED EMBODIMENTS

Figure 1A:
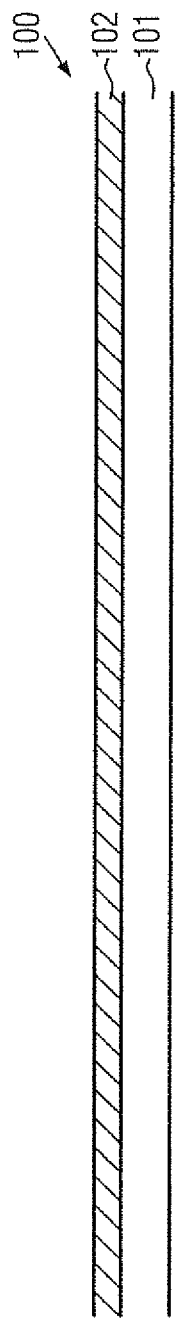
FIGS. 1a to 1h schematically illustrate cross-sectional views of a process flow for forming series connected solar cells on the basis of lithography and etch sequences according to illustrative embodiments of the present invention, FIG. 1i schematically illustrates a top view of a solar module including a plurality of series connected solar cells according to the present invention, FIG. 1j schematically illustrates a cross-sectional view of the solar module of FIG. 1i, FIG. 1k schematically illustrates a cross-sectional view of a solar module, in which the series connection and the corresponding current flow are illustrated, in accordance with the present invention FIG. 1l schematically illustrates a cross-sectional view of a portion of the solar module including corresponding lateral dimensions of contact and isolation trenches according to illustrative embodiments of the present invention, FIG. 1m schematically illustrates the solar module formed on the basis of a flexible substrate material according to an illustrative embodiment of the present invention, FIG. 2 schematically illustrates efficiency measurement results of various thin-film solar modules, thereby indicating superior performance at low light intensities of the solar modules of the present invention, FIGS. 3a to 3c schematically illustrate cross-sectional views of a solar module during various manufacturing stages, in which the patterning is achieved on the basis of a reduced number of lithography processes according to illustrative embodiments of the present invention, and FIGS. 4a to 4c schematically illustrate cross-sectional view of a solar module during various manufacturing stages, wherein the patterning of the various layers is accomplished by a reduced number of lithography processes according to further illustrative embodiments of the present invention.

FIG. 1a schematically illustrates a cross-sectional view of a solar module 100 in a manufacturing stage, in which a carrier material 101, such as a semiconductor wafer and the like, is provided in order to receive a substrate material 102 of the solar module 100. The substrate material 102 may be selected as any appropriate carrier material, wherein in preferred embodiments substrate materials may be used, which may typically not be considered appropriate for applying conventional patterning techniques on the basis of laser scribing techniques. For example, the substrate material 102 may be generally a flexible material in the form of polyimide or any other plastic material.

It should be appreciated, however, that, although flexible substrates provide for superior performance in particular in indoor applications, basically the present invention may also be implemented in the context of any other carrier material, as are also typically used in conventional solar modules. The substrate material 102 may be formed on the carrier 101 by any appropriate process technique, such as deposition processes using a gaseous process atmosphere, and the like.

Figure 1B:
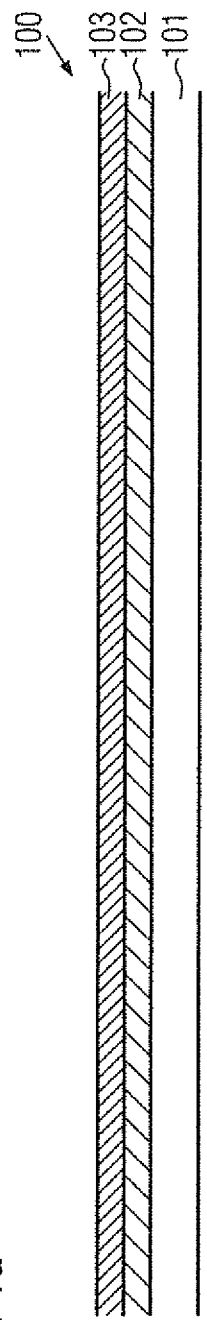

FIG. 1b schematically illustrates the solar module 100 in a stage, in which a rear side metallization layer 103, for instance in the form of a molybdenum (Mo) layer or any other appropriate conductive material is formed on the substrate material 102. To this end any appropriate deposition technique may be applied on the basis of CVD, physical vapour deposition, roll to roll techniques, and the like. Furthermore, the rear side metallization layer 103 is applied with a thickness of several hundred nanometres to several µm, depending on the overall device requirements of the module 100.

Figure 1C:
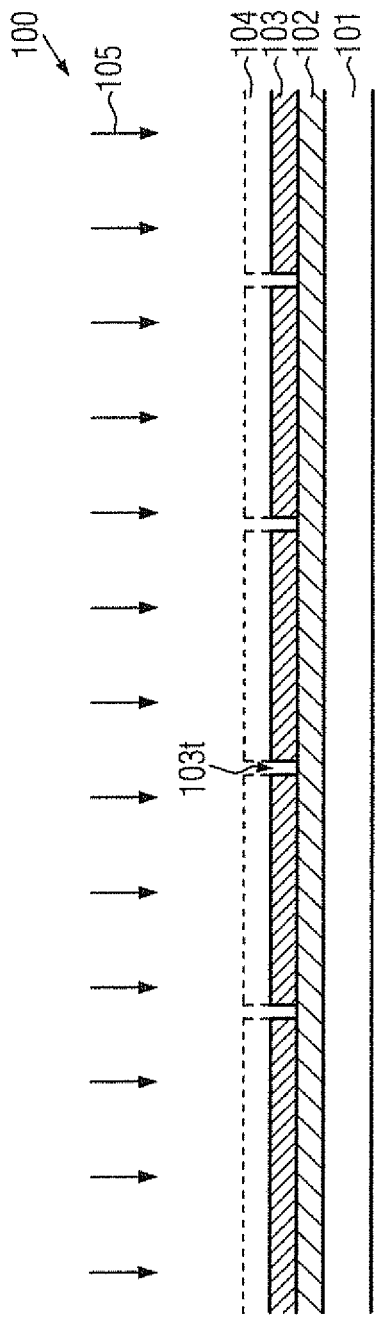

FIG. 1c schematically illustrates the module 100 in a manufacturing stage, in which a first lithography and etch sequence 105 is applied so as to pattern the rear side metallization layer 103. During the sequence 105 an appropriate mask layer 104, such as a resist material, is applied and is patterned on the basis of a lithography process using a specific lithography mask (not shown) in order to define the lateral size, shape and position of isolation trenches 103t to be formed in the metallization layer 103. It should be appreciated that the sequence 105 may include a lithography process that may be performed on the basis of non-critical lithography tools and process recipes, since the width of the isolation trenches 103t may be in the range of 1 to several micrometres, which is well within the capability of presently established lithography techniques. After forming the etch mask 104 an appropriate etch process may be performed, which may include wet chemical etch chemistries and/or plasma assisted etch recipes, wherein the substrate material 102 may act as an efficient etch stop material.

Due to the nature of the etch process the layer 103 may be patterned in a well defined manner, thereby reducing the probability of creating patterning related material residues, such as metal flakes, as are typically produced in laser scribing techniques, as discussed above. Nevertheless, generally the width of the isolation trenches 103t may be significantly less compared to trench width values obtained by even sophisticated laser techniques.

Thereafter the process sequence 105 is continued by removing the etch mask 104, which may be accomplished by well-established wet chemical or plasma assisted strip processes.

Figure 1D:
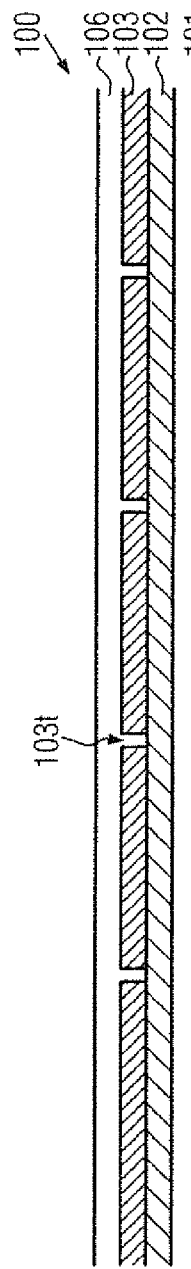

FIG. 1d schematically illustrates the solar module 100 after the deposition of a semiconductor layer 106, which may be provided, in one embodiment, as an amorphous hydrogenated silicon material or as a silicon-based semiconductor material comprising amorphous and microcrystalline silicon material. To this end, well-established deposition recipes are available, for instance based on CVD, roll to roll techniques, and the like. It should be appreciated that the layer 106 may be provided in the form of any other appropriate semiconductor material, for instance in the form of semiconductor materials as are also used in other conventional thin-film solar modules.

Typically the semiconductor layer 106 is formed so as to comprise p-doped areas and n--doped areas in order to provide an appropriate depletion region for efficiently converting radiation energy into separated electron/hole pairs. For example, a p-i-n layer may be formed, as is frequently used in thin-film solar cells. The appropriate doping of the semiconductor layer 106 may be accomplished by incorporating appropriate dopant species during the deposition of the semiconductor base material and/or by incorporating dopant species on the basis of ion implantation, diffusion, and the like.

Figure 1E:
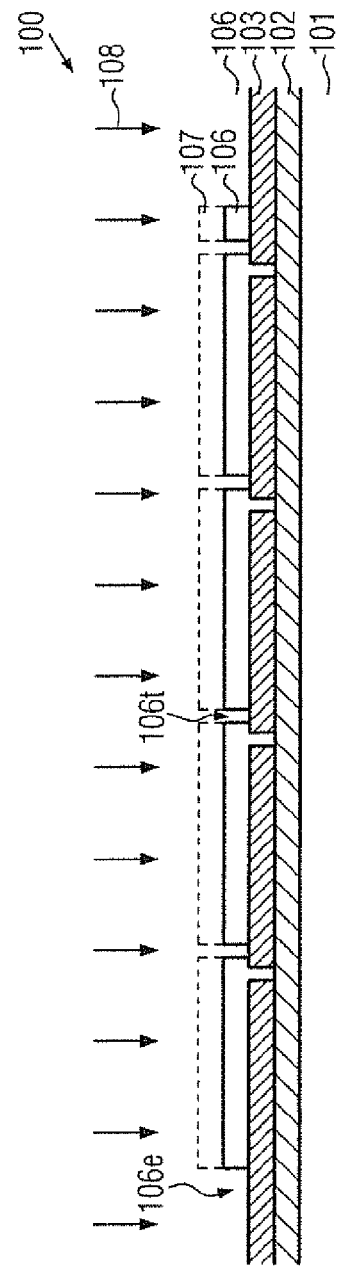

FIG. 1e schematically illustrates the solar module 100 in a further advanced manufacturing stage, in which a further lithography and etch sequence 108 is applied so as to form contact trenches 106t in the semiconductor layer 106. To this end, an etch mask 107, such as a resist mask, and the like, may be formed on the basis of a corresponding lithography process using a dedicated lithography mask (not shown). In this manner, the lateral position and the size of the contact trenches 106t is defined in the layer 106 and also the spatial relationship with respect to the previously formed isolation trenches 103t is determined during the corresponding lithography process.

After providing the etch mask 107 an appropriate etch process is applied during the sequence 108, in which the material of the semiconductor layer 106 is efficiently removed, while the layer 103 may act as an efficient etch stop material. To this end, well-established etch recipes are available, for instance by using plasma assisted etch recipes or wet chemical etch recipes having a pronounced etch selectivity with respect to the material 103. It should be appreciated that the etch mask 107 may also be used for defining edge regions 106e in the semiconductor layer 106, thereby determining, in combination with a subsequent patterning process, the overall size of the module 100. Finally, during the sequence 108 the etch mask 107 is removed on the basis of well-established process techniques.

Figure 1F:
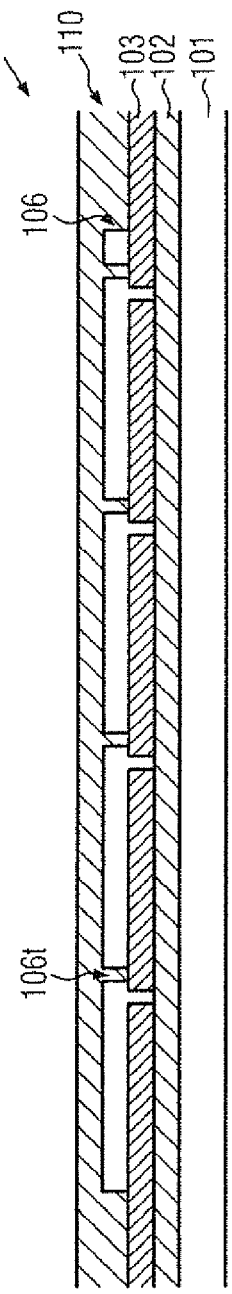

FIG. 1f schematically illustrates the module 100 after the deposition of a transparent conductive layer, which is also referred to as a front side metallization layer 110, thereby forming a conductive material above their patterned semiconductor layer 106 and within the contact trenches 106t. The deposition of the material 110 may be accomplished on the basis of well-established process techniques.

Figure 1G:
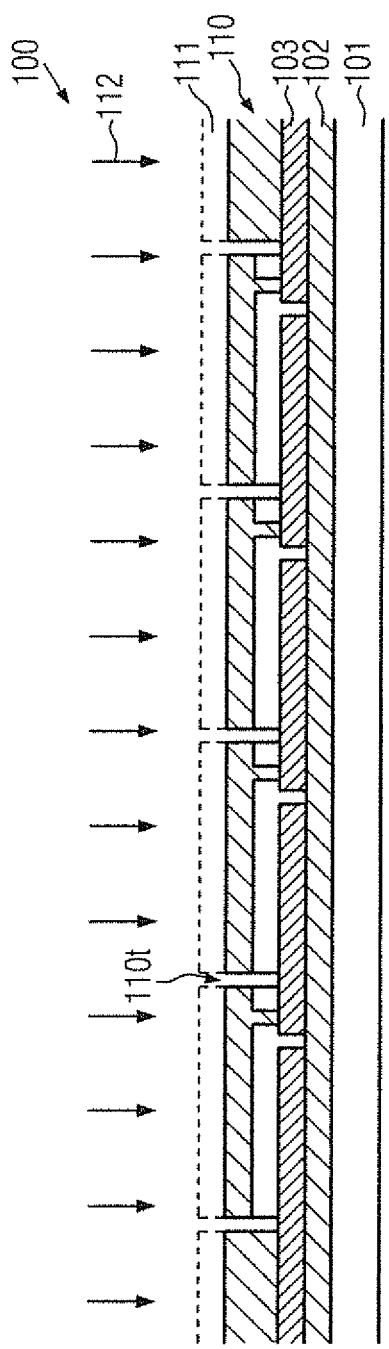

FIG. 1g schematically illustrates the module 100 during a further lithography and etch sequence 112, in which an etch mask 111 is formed so as to define the lateral size, shape and position of isolation trenches 110t, 106i to be formed in the front side metallization layer 110 and the semiconductor layer 106, respectively. It should be appreciated that the isolation trenches 106i laterally separate the semiconductor layer 106 into individual semiconductor regions 106r corresponding to individual solar cells to be connected in series.

Similarly, the isolation trenches 110t formed in the front side metallization layer 110 provided laterally isolated electrode portions for the corresponding separated semiconductor regions 106r. The etch process used in the sequence 112 may comprise appropriately adapted etch recipes so as to etch through the material 110 using, for instance, the materials 103 and 106 as an efficient etch stop materials. Thereafter, an appropriate etch chemistry is selected so as to continue the etch process in order to form the trenches 106i, while using the material 103 as an efficient etch stop material.

It should be appreciated that in some illustrative embodiments (not shown) the etch process in the sequence 112 may also be used so as to determine appropriate edge regions in the layer 110 as required for the module 100. In other cases, a dedicated patterning sequence may be applied so as to define the lateral dimension of the module 100, which may comprise a desired number of series connected solar cells. That is, appropriate edge regions for the module 100 may be formed on the basis of the lithography and etch sequences 105, 108 and 112 without requiring an additional lithography and etch sequence.

Figure 1H:
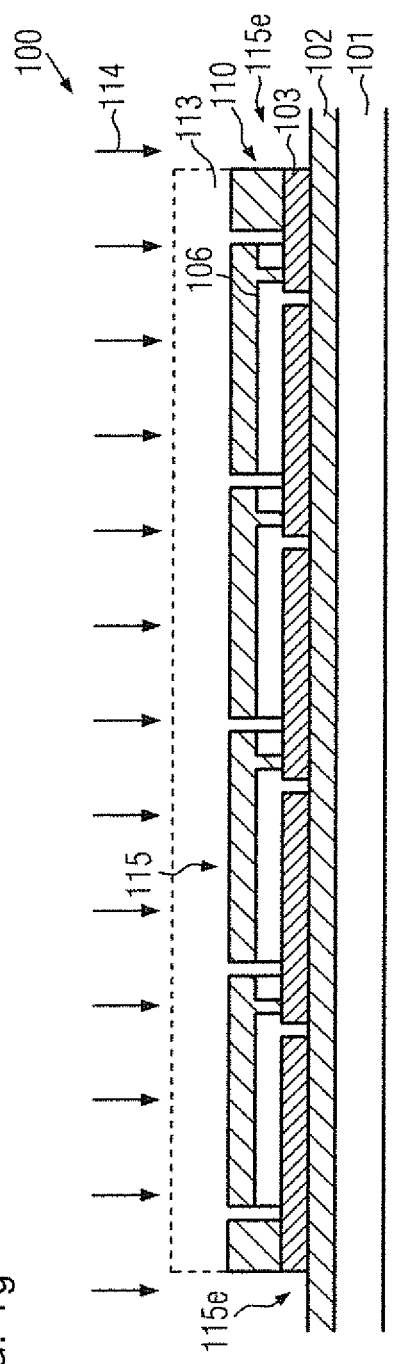

FIG. 1h schematically illustrates the module 100 according to one illustrative embodiment, in which a dedicated lithography and etch sequence 114 is applied in order to determine the lateral dimensions of the module 100 and to provide appropriately configured edge regions in order to properly contact the module 100. To this end, the sequence 114 comprises the formation of an etch mask 115 based on a dedicated lithography mask (not shown) and this etch mask 115 is then used to pattern the layers 110 and 103 in order to obtain the desired lateral dimensions. To this end, any well-established etch technique may be applied.

FIG. 1*i* schematically illustrates a top view of the module 100 including a plurality of solar cells that are connected in series according to the above described process sequence on the basis of lithography and etch techniques. As shown, a length 115*l* and a width 115*w* of the module 100 may be selected so as to include a desired number of solar cells, wherein also appropriate lateral dimensions of edge regions 102*e* are selected, thereby also determining the number and size of the solar cells and contact areas of the module 100 provided by the front side metallization layer 110. For example, a length 110*l* and a width 110*w* may be selected in correlation with the dimensions 115*l*, 115*w* so as to meet the design requirements for the module 100.

FIG. 1*j* schematically illustrates a cross-sectional view of the module 100 of FIG. 1*i*. As shown, a plurality of solar cells 120 is provided, wherein the individual solar cells 120 are laterally isolated from each other on the basis of the isolation trenches 110*t*, 106*t*, while the rear side metallization layer 103 is laterally divided into isolated electrode regions on the basis of the isolation trenches 103*t*. On the other hand, the contact trenches 106*t*, which are filled with the conductive material of the layer 110, electrically connect a dedicated electrode region of the layer 103 with the transparent upper electrode region, i.e. a corresponding portion of the layer 110, in order to form a corresponding electrical path through the module 100. Moreover, edge regions 115*e* provide electrical contact areas for connecting to the upper electrode portion of the first solar cell (right hand side of FIG. 1*j*) and for connecting to the lower electrode of the last solar cell (left hand side of FIG. 1*j*).

FIG. 1*k* schematically illustrates the current flow through the plurality of solar cells 120.

FIG. 1*l* schematically illustrates a cross-sectional view of the module 100 according to illustrative embodiments, in which substantially the same pitches are used for patterning the layers 103, 106 and 110. For example, a pitch 103*p* defining the lateral extension of the bottom electrode of a single solar cell on the basis of the isolation trenches 103*t* is equal to a pitch 106*p* defined in the semiconductor layer 106 by the contact trenches 106*t*. Moreover, the pitches 103*p*, 106*p* are equal to a pitch 110*p* that defines the isolated electrode portions of the layer 110 on the basis of the isolation trenches 110*t* in combination with the isolation trenches 106*i* formed in the semiconductor layer 106.

In the example shown, a value of 4250 μm is selected for the stripe like solar cells, wherein it is to be understood that the lateral dimension perpendicular to the drawing plane of FIG. 1*l* may be selected in accordance with the design requirements, as is for instance also discussed with reference to FIG. 1*i*. Furthermore, the width of the various trenches, such as the isolation trenches 103*t*, 110*t* and 106*i* and the contact trenches 106*t*, indicated as D2, may be selected so as to obtain a desired reduced dead area in the module 100, wherein in illustrative embodiments, the corresponding width D2 is selected to 25 μm or less, and preferably 10 μm or less.

In the embodiment shown in FIG. 1*l* the width of the trenches is selected to be equal, while in other cases, different lateral dimensions may be selected, as will be described later on in more detail. Furthermore, the lateral overlap of the various electrode portions and semiconductor regions, as indicated as D1, may also be selected with reduced values compared to conventional thin-film modules in order to increase the overall active area of the module 100. For example, the same values may be used for the lateral dimensions D1 and D2, while it should be understood that also different values may be applied. Moreover, it is to be noted that due to patterning of the material layers 103, 106 and 110 on the basis of lithography and etch techniques even relatively small dimensions can be implemented without increasing the probability of creating undue leakage paths, even if relatively non-sophisticated lithography techniques are applied.

For example, the lateral dimensions D1 and D2 may be selected to 1 μm and even less, if considered appropriate while in other cases, at least these dimensions may be adjusted to significantly less than 10 μm, such as 6 μm and less, thereby obtaining lateral dimensions that are reduced by a factor of approximately 10 compared to sophisticated laser scribing techniques.

Figure 1M:
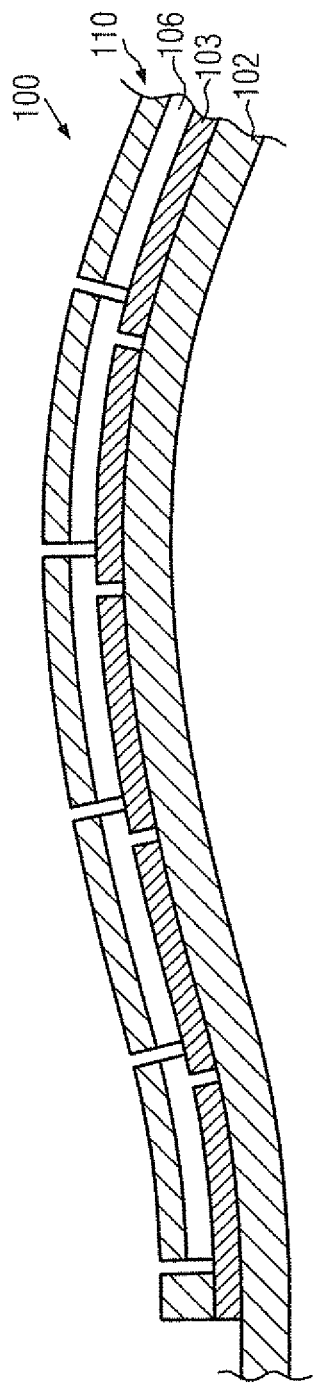

FIG. 1*m* schematically illustrates a cross-sectional view of the module 100 according to a preferred embodiment, in which the substrate material 102 is provided in the form of a flexible material, wherein the patterning of the layers 103, 106 and 110 may be accomplished by using strategies and design values, as indicated above. Hence, a plurality of substrate materials, as discussed above, may advantageously be used, in particular for indoor applications while providing superior performance of the module 100 compared to conventional thin-film modules. It should be appreciated that the substrate material 102 may efficiently be separated from any carrier material, such as the carrier material 101 illustrated in preceding figures by any appropriate delamination process.

Figure 2:
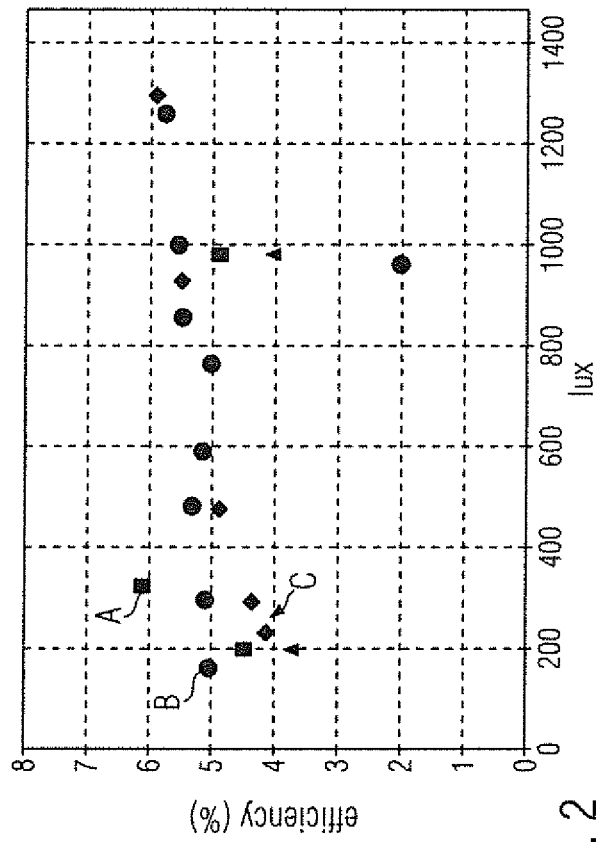

FIG. 2 schematically illustrates measurement results of the module efficiency for various thin-film modules, wherein the measurement points A and B represent the results of a thin film module formed on the basis of the above described process sequence and provided on a flexible substrate material, as is for instance shown in FIG. 1*m*. The results have been obtained by exposing the various solar modules to radiation as is typically encountered in indoor applications, for instance by using a standard incandescence lamp (F12 spectrum).

The horizontal axis describes the light intensity, while the vertical axis represents the total module efficiency. As is evident from FIG. 2 in particular for low light intensity applications below approximately 300 lux the thin-film modules of the present invention, represented by A and B, provide for superior performance compared to conventional thin-film modules, indicated by measurement points C.

With reference to FIGS. 3*a* to 3*c* and 4*a* to 4*c* further illustrative embodiments will now be described, in which the number of lithography processes may be reduced.

Figure 3A:
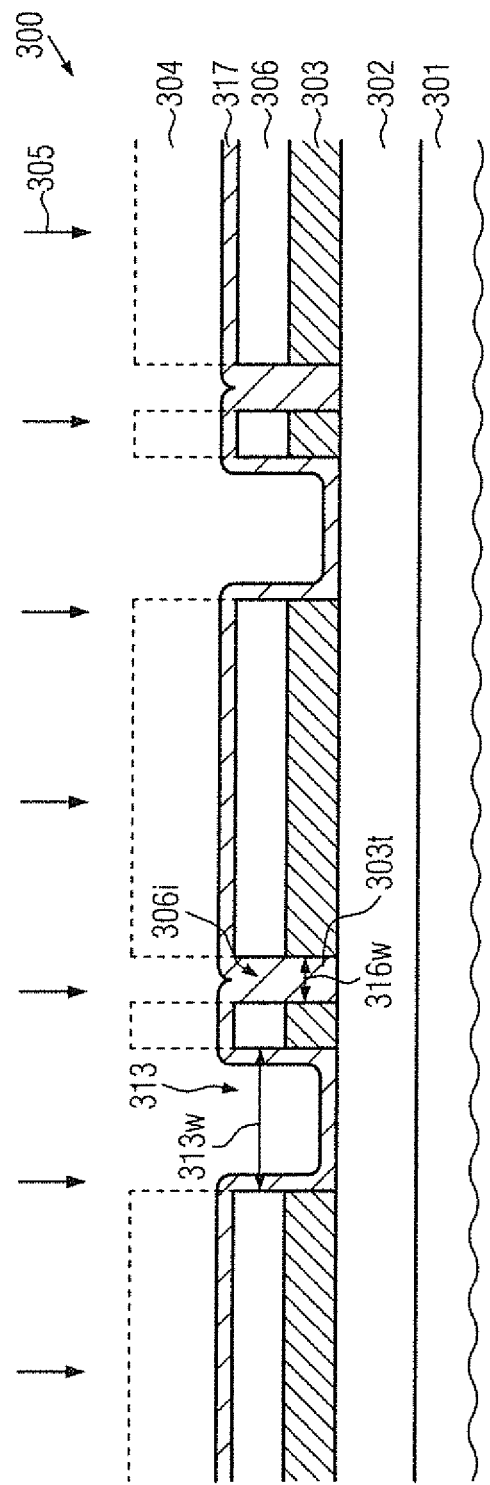

FIG. 3*a* schematically illustrates a cross-sectional view of a module 300 in an advanced manufacturing stage. As shown, a substrate material 302 is formed on an appropriate carrier 301, followed by a patterned rear side metallization layer 303 and a semiconductor layer 306. With respect to the material characteristics and methods of forming corresponding material layers, the same criteria apply as previously explained with reference to the module 100. Furthermore, in the manufacturing stage shown, isolation trenches 303*t*, 306*i* are formed in the rear side metallization layer 303 and the semiconductor layer 306, respectively.

The trenches 306*i*, 303*t* are aligned to each other and have a width 316*w*. Similarly, a contact trench 313 is formed in the layer 306 and also extends into and through the layer 303. The contact trench 313 has a width 313*w* that is greater than the width 316*w* of the isolation trenches. Moreover, a dielectric layer 317, which may represent any appropriate insulating material, is formed in a substantially conformal manner so as to cover any exposed surface areas of the semiconductor layer 306 and within the contact trench 313, while the isolation trenches 303t, 306i are substantially completely filled with the material of the layer 317.

The device 300 as shown in FIG. 3a may be formed on the basis of process techniques as described above in order to form the materials 303 and 306. Thereafter, a single lithography and etch sequence 305 is applied, in which an appropriate etch mask 304 is provided, for instance in the form of a resist material, by using a dedicated lithography mask that defines corresponding openings in the mask 304 in order to form the trenches 306i, 303t and 313 with the desired lateral dimensions. Consequently, on the basis of the etch mask 304 an etch sequence may be applied so as to etch through the layer 306 and subsequently through the layer 303 without requiring an additional lithography process.

To this end, any well-established etch recipes may be used, as is also discussed above with reference to the module 100. Thereafter, the dielectric layer 317 is deposited, for instance by CVD, wherein the initial layer thickness is selected in correlation with the dimensions 316w and 313w such that the trenches 306i, 303t are completely filled while the surface areas of the trench 313 are only coated by the dielectric layer 317.

FIG. 3b schematically illustrates the module 300 in a further advanced manufacturing stage. As shown, an etch process 318, such as a plasma assisted or wet chemical isotropic etch process is applied so as to remove material of the dielectric layer 317. Consequently, during the etch process 318 the dielectric material of the layer 317 may efficiently be removed from within the trench 313 and also from above the layer 306. On the other hand, a significant amount of the dielectric material 317 is preserved within the isolation trenches 306i, 303t.

FIG. 3c schematically illustrates the module 300 after the above described process sequence. Hence, the contact trench 313 and the layer 306 are exposed, while the isolation trenches 306i, 303t still contain a significant amount of the material of the layer 317, thereby at least reliably electrically isolating regions 303a and 303b of the electrode layer 303 from each other. In this stage a transparent front side metallization layer 310 may be deposited on the basis of any appropriate deposition technique, thereby forming a conductive material in the contact trench 313 so as to connect to the bottom metallization layer 303. On the other hand, an electrical contact to the regions 303a, 303b within the isolation trenches 306i, 303t is reliably suppressed due to the presence of the remaining material of the layer 317.

Consequently, upon patterning the layer 310 so as to form isolation trenches 310t a series connection of the individual solar cells may be accomplished, wherein the number of lithography processes is reduced compared to the previously described embodiments. FIG. 4a schematically illustrates a cross-sectional view of a module 400 comprising a carrier material 401, a substrate material 402, a rear side metallization layer 403, a semiconductor layer 406 and a dielectric layer 417.

With respect to these various components, the same criteria may apply, as previously explained with reference to the module 300. Furthermore, the rear side metallization layer 403 and the semiconductor layer 406 are patterned so as to include a contact trench 413 extending through the layers 406, 403 and isolation trenches 406i, 403t formed in the layers 406, 403, respectively. Moreover, a width 416W of the isolation trenches is greater than a width 413W of the contact trench 413. Upon depositing the dielectric layer 417 process parameters are selected in correlation with the lateral dimensions of the trenches 413, 406i, 403t such that significant material deposition within the contact trench 413 is suppressed, while exposed surface areas of the isolation trenches are reliably covered by the material of the layer 417. Consequently, during the deposition of the layer 417 the trench 413 is closed in an early stage of the deposition process.

FIG. 4b schematically illustrates the module 400 when exposed to an etch atmosphere 418, which includes a plasma assisted anisotropic etch process in order to etch the material layer 417. Consequently, during the etch process 418, which may additionally comprise a wet chemical cleaning process, and the like at a final phase, the contact trench 413 is re-opened and also the semiconductor layer 406 is exposed. On the other hand, sidewall spacers 417s are formed within the isolation trenches 406i, 403t, thereby reliably covering at least the sidewalls of the layer 403.

Figure 4C:
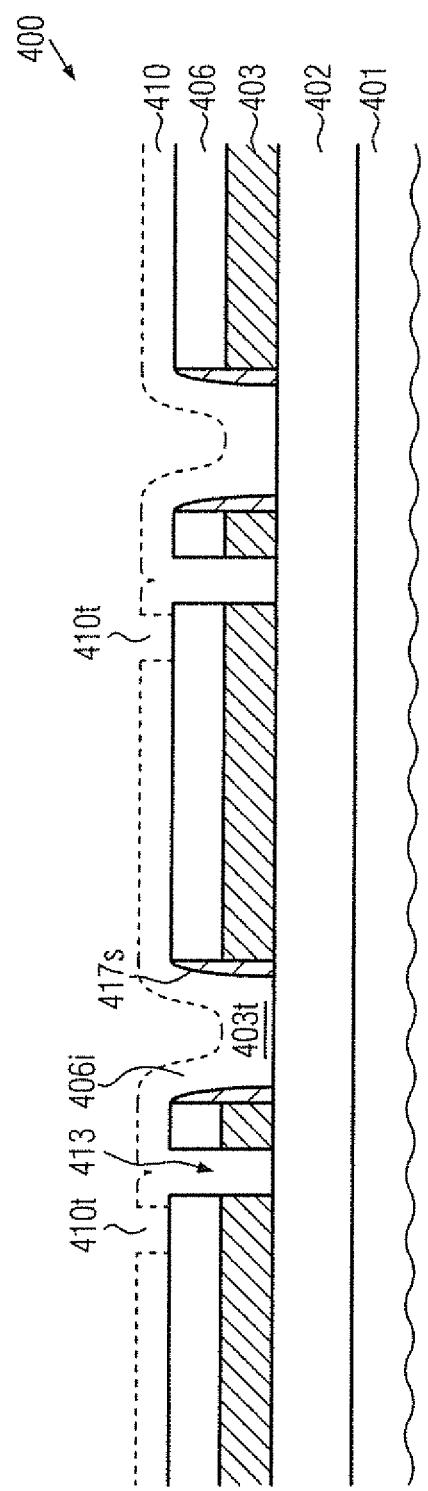

FIG. 4c schematically illustrates the module 400 upon depositing a conductive transparent front side layer 410 above the semiconductor layer 406 and within the trenches 413, 406i, 403t. Consequently, within the contact trench 413 the material of the layer 410 reliably connects to the layer 403, while at least in the isolation trench 403t an efficient electrical insulation between the layer 410 and the layer 403 is provided by the sidewall spacers 417s. Hence, by appropriately patterning the layer 410 in order to form isolation trenches 410t therein a series connection of the individual solar cells may be established, as is also discussed above, wherein the number of required lithography processes may be reduced.

It should be appreciated that the lateral dimensions of the contact trenches and isolation trenches in the embodiments described with reference to FIGS. 3 and 4 may be selected to be well below the lateral dimensions of trenches formed on the basis of sophisticated laser scribing techniques, thereby also increasing the effective cell area in the thin film modules of the present invention.

That which is claimed is:

1. A method of forming a solar module comprising:
   forming a rear side metallization layer on an insulating substrate;
   forming at least one first isolation trench in the rear side metallization layer;
   forming a semiconductor junction layer on the rear side metallization layer; forming at least one second isolation trench on the semiconductor junction layer and at least one contact trench in the rear side metallization layer and the semiconductor junction layer so as to provide laterally isolated semiconductor junction layer regions, with the contact trench having a width different from a width of the at least one first and second isolation trenches;
   forming a transparent front side metallization layer on the semiconductor junction layer and in the at least one contact trench; and
   patterning the front side metallization layer so as to form series-connected solar cells based on the laterally isolated semiconductor junction layer regions.

2. The method of claim 1, wherein at least one of the at least one first isolation trench, the at least one contact trench, and the at least one second isolation trench are formed via lithography.

3. The method of claim 1, wherein the semiconductor junction layer comprises a p and n semiconductor junction layer.

4. The method of claim 1, wherein the semiconductor junction layer comprises a p-i-n semiconductor junction layer.

5. The method of claim 4, wherein the p-i-n semiconductor layer is formed as an amorphous semiconductor layer.

6. The method of claim 4, wherein the p-i-n semiconductor layer is formed as a microcrystalline semiconductor layer.

7. The method of claim 1, wherein patterning the front side metallization layer comprises applying a lithography process.

8. The method of claim 1, wherein patterning the front side metallization layer comprises forming at least one third isolation trench in the front side metallization layer; and wherein the at least one second isolation trench in the semiconductor junction layer and the at least one third isolation trench are formed in a common lithography and etch sequence.

9. The method of claim 1, wherein forming the at least one first isolation trench in the rear side metallization layer comprises applying a first lithography and etching sequence prior to forming the semiconductor junction layer.

10. The method of claim 9, wherein forming the at least one contact trench comprises applying a second lithography and etching sequence.

11. The method of claim 1, wherein the at least one first isolation trench in the rear side metallization layer, the at least one second isolation trench, and the at least one contact trench are formed by performing a single lithography and etching sequence.

12. The method of claim 11, wherein performing the single lithography and etching sequence comprises forming the at least one contact trench to have a greater width than the first and second isolation trenches, forming a conformal dielectric layer so as to cover exposed surface areas of the at least one contact trench and so as to fill the first and second isolation trenches, and removing the conformal layer from the at least one contact trench prior to forming the front side metallization layer.

13. The method of claim 12, wherein removing the conformal layer from the at least one contact trench comprises performing a non-masked isotropic etch process.

14. The method of claim 11, wherein the at least one contact trench is formed to have a width less than a width of the first and second isolation trenches; and further comprising forming a dielectric layer above the at least one contact trench and in the first and second isolation trenches, and patterning the dielectric layer so as to re-open the at least one contact trench and form sidewall spacers on sidewalls of the first and second isolation trenches.

15. The method of claim 1, wherein the at least one of the at least one contact trench, the at least one first isolation trench, and the at least one second isolation trench are formed to have a width that is no more than 25 μm.

16. The method of claim 1, further comprising performing a lithography and etching sequence so as to define lateral dimensions of the solar module.

17. The method of claim 16, wherein the insulating substrate comprises a flexible substrate material.

18. A method of forming a solar module comprising:
forming a rear side conductive layer on an insulating substrate;
forming at least one first isolation trench in the rear side conductive layer;
forming a semiconductor junction layer on the rear side conductive layer;
forming at least one second isolation trench on the semiconductor junction layer and at least one contact trench in the rear side metallization layer and the semiconductor junction layer so as to provide laterally isolated semiconductor junction layer regions, with the contact trench having a width different from a width of the at least one first and second isolation trenches;
forming a transparent front side conductive layer on the semiconductor junction layer and in the at least one contact trench; and
patterning the front side conductive layer so as to form series-connected solar cells based on the laterally isolated semiconductor junction layer regions of the semiconductor junction layer.

19. The method of claim 18, wherein the semiconductor junction layer comprises a p and n semiconductor junction layer.

20. The method of claim 18, wherein the semiconductor junction layer comprises a p-i-n semiconductor junction layer.

21. The method of claim 18, wherein patterning the front side conductive layer comprises applying a lithography process.

22. The method of claim 18, wherein patterning the front side conductive layer comprises forming a third isolation trench in the front side conductive layer; and wherein the at least one second isolation trench in the semiconductor junction layer and the third isolation trench are formed in a common lithography and etch sequence.

* * * * *

UNITED STATES PATENT AND TRADEMARK OFFICE
CERTIFICATE OF CORRECTION

PATENT NO. : 9,276,149 B2  
APPLICATION NO. : 13/556469  
DATED : March 1, 2016  
INVENTOR(S) : Foti et al.

Page 1 of 1

It is certified that error appears in the above-identified patent and that said Letters Patent is hereby corrected as shown below:

| | |
|---|---|
| Title Page, Item 75 | Delete: "AnastasIA"<br>Insert --Anastasia-- |
| Claims | |
| Column 14, Line 18, Claim 18 | Delete: "iunction"<br>Insert --junction-- |

Signed and Sealed this  
Third Day of May, 2016

Michelle K. Lee  
*Director of the United States Patent and Trademark Office*